United States Patent [19]
Schmatz et al.

[11] Patent Number: 5,157,997
[45] Date of Patent: Oct. 27, 1992

[54] CUTTING TOOL FOR ALUMINUM WORKPIECES HAVING ENHANCED CRATER WEAR RESISTANCE

[75] Inventors: Duane J. Schmatz, Dearborn Heights; John S. Badgley, Dearborn; Charles O. McHugh, Dearborn Heights, all of Mich.

[73] Assignee: Ford Motor Company, Dearborn, Mich.

[21] Appl. No.: 220,125

[22] Filed: Jul. 15, 1988

Related U.S. Application Data

[62] Division of Ser. No. 133,286, Dec. 16, 1987, Pat. No. 4,936,959.

[51] Int. Cl.$^5$ ............................................. B23B 27/14
[52] U.S. Cl. .................................................. 82/1.11
[58] Field of Search ........................................ 82/1.11

[56] References Cited

U.S. PATENT DOCUMENTS

4,356,376 10/1982 Komanduri et al. ................ 82/1 C
4,728,579 3/1988 König ................................ 428/472

Primary Examiner—Bruce M. Kisliuk
Assistant Examiner—John A. Marlott
Attorney, Agent, or Firm—Joseph W. Malleck; Roger L. May

[57] ABSTRACT

An iron-based cutting tool, useful for machining aluminum-based workpieces at surface speeds at or in excess of 1000 sfm, is fabricated by (i) removing surface impurities from the surface of the cutting tool which will be exposed to crater wear during such machining, the removal being by sputtering or ion bombardment using the surface as a target thereby resulting in a cleansed activated surface; and (ii) depositing a single-phase crystal film of sputtered silicon carbide onto the cleansed activated surface.

The activation of the surface in step (i) is carried out by causing ionized argon to be accelerated against the surface maintained at about zero bias and the depositing of step (ii) is carried out to cause silicon carbide to be condensed onto the activated surface as a result of being dislodged from a silicon carbide target maintained at about zero bias for at least 300 minutes. The film of silicon carbide has a thickness in a range of about 1-4 microns, and the crystal orientation of such film is amorphous.

1 Claim, 1 Drawing Sheet

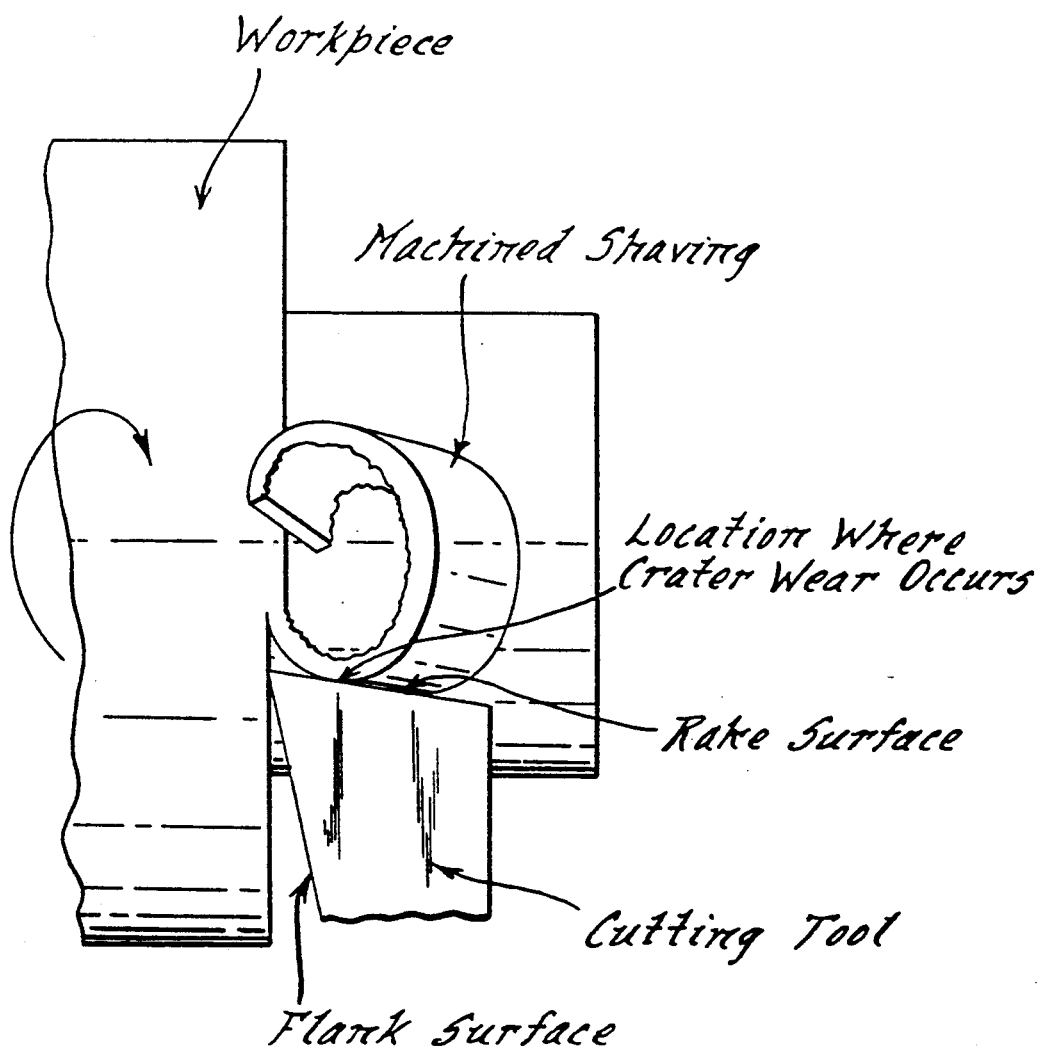

CUTTING TOOL FOR ALUMINUM WORKPIECES HAVING ENHANCED CRATER WEAR RESISTANCE

This is a Division of application Ser. No. 133,826, filed Dec. 16, 1987 now U.S. Pat. No. 4,936,959.

BACKGROUND OF THE INVENTION

1. Technical Field

This invention relates to cutting tools for machining aluminum-based workpieces and, more particularly, to the construction, method of making, and method of using a cutting tool that is effective in reducing crater wear when continuously machining at surface speeds of 1000 sfm or more.

2. Discussion of the Prior Art

Cutting tools used for continuous machining operations, such as milling, turning, and drilling have utilized various hard wear resistant coating systems principally on tool steel or cemented carbides. The specific coating system has been influenced by two basic considerations: the physical characteristics of the substrate, and the type of material of the workpiece that is to be cut.

Coating systems designed for cutting tools which are to be used to cut iron-based workpieces have been designed with wear resistance as the main characteristic to be improved. To enhance wear resistance of cemented carbide substrates, very hard particles have been coated thereon by chemical vapor deposition techniques. Typically, these coating systems have been of a multilayer (stratified) character. This art is generally depicted in U.S. Pat. Nos. 4,416,670; 4,442,169; 4,101,703; 3,955,038; 3,977,061; 4,237,184; and 4,357,382. Unfortunately, chemical vapor deposition techniques are limited to substrate materials which can withstand a high temperature during fabrication, such temperatures being in the range of about 1000° C. If such chemical vapor deposition techniques were employed on steel substrates, the hardened characteristics of the steel would be disrupted or destroyed.

Tool steel used to cut principally iron-based workpieces have also had coating systems designed to concentrate accordingly on the characteristic of wear resistance. Hard materials, such as carbides and nitrides of titanium, zirconium and hafnium, have been deposited by such techniques as ion plating (see U.S. Pat. Nos. 4,169,913 and 4,401,719). Ion plating is desirable because of its tendency to obtain greater disorder of the crystal lattice and greater density of the lattice defect to obtain greater wear resistance. Analogously, in U.S. Pat. No. 4,341,843, a sputtering technique was employed to deposit a film of titanium carbide onto a steel substrate for the purpose of achieving high wear resistance but not necessarily for use on a cutting tool.

What is missing in the referenced art is a consideration of how such coating systems would function for resisting crater wear. Crater wear is a combination phenomenon resulting in high temperature tearing and energy impact at high surface speeds of cutting, as well as high temperature oxidation. Crater wear is particularly troublesome with respect to cutting aluminum workpieces. Although wear resistance is of some importance, it is not as important as crater wear resistance. It is with this specific set of conditions that this invention is concerned, the use of iron-based substrates to machine aluminum-based workpieces at high surface speeds. Thus, the relevant prior art would be coating systems designed for these specific conditions. Applicants are unaware of any prior art which discloses coating systems designed specifically for such applications.

SUMMARY OF THE INVENTION

The invention, in one aspect, is a method of making an iron-based cutting tool useful for machining aluminum-based workpieces at surface speeds at or in excess of 1000 surface feet per minute (sfm). Such method comprises (i) removing surface impurities from the surface of the cutting tool which will be exposed to crater wear during the machining, the removal being by sputtering or ion bombardment using the surface as a target thereby resulting in a cleansed activated surface; and (ii) depositing a single-phase crystal film of sputtered silicon carbide onto the cleansed activated surface.

The activation of the surface in step (i) is preferably carried out by causing ionized argon to be accelerated against the surface maintained at about zero bias for a period of about 2–4 minutes; preferably, the depositing of step (ii) is carried out to cause silicon carbide to be condensed onto the activated surface as a result of being sputtered from a silicon carbide target for at least 300 minutes. Advantageously, the film of silicon carbide has a thickness in a range of about 1–4 microns, and the crystal orientation of such film is amorphous.

The invention, in another aspect, is a cutting tool for machining aluminum workpieces at surface speeds in excess of 1000 sfm, the tool having enhanced crater wear resistance. The tool comprises (a) a preshaped base of steel having a cutting edge defined by the juncture of flank and rake surfaces, and (b) a single-phase crystal film of sputtered silicon carbide coated onto at least the rake surface. Advantageously, the cutting tool has a crater wear resistance represented by a K value of less than 0.08 when measured at a distance of 0.03–0.045 inches from the cutting edge and viewed at an angle of zero or 30° from the flank cutting edge.

Still another aspect of this invention is a new method of use, the use being for machining aluminum-based workpieces at high surface speeds exceeding 1000 sfm. The method of use comprises moving an iron-based cutting tool against an aluminum-based workpiece to continuously shear off a shaving of said workpiece, the cutting tool having a rake face contacted by the shaving, which face is coated with a single-phase crystal film of sputtered silicon carbide.

SUMMARY OF THE DRAWINGS

The FIGURE is a schematic view of a cutting tool of this invention for carrying out machining against an aluminum workpiece.

DETAILED DESCRIPTION AND BEST MODE

High speed steel cutting tool inserts coated with a thin single-phase layer of silicon carbide by a dual ion beam sputtering technique show a marked improvement in resistance to crater wear when machining aluminum-based workpieces.

High speed tool steels typically have designations of the M or T type. Those with an M designation contain tungsten, molybdenum, chromium and vanadium as alloying ingredient and sometimes cobalt. The tungsten will be in the range of 1.5–20% by weight, the chromium in the range of 3.75–4.50% by weight, and vanadium in the range of 1–5.0% by weight. Molybdenum, when present, will preferably be in the range of 3.75–9.5%, and cobalt, when present, in the range of 5-12%. Carbon, for high speed tool steels, is in the range of 0.75-1.25% by weight. However, this invention is believed to be applicable to all iron-based cutting tool substrates; iron based is used herein to mean metal cutting tool substrates which have an iron content in excess of 50% by weight. Similarly, aluminum-based is used herein to mean a workpiece having aluminum content in excess of 50% by weight.

Tool steels require special heat treatment in order that their unique properties may be fully realized. For example, a special heat treatment of heating to a high temperature (2150°-2400° F. or 1176°-1315° C.) to obtain solution of substantial percentage of the alloy carbides, quenching to room temperature, at which stage a considerable amount of the austenite is retained tempering at 1000°-1150° F. or 538°-621° C., and again cooling to room temperature. During tempering, alloy carbides are precipitated, resulting in marked secondary hardening and a reduction of alloy content in the retained austenite which then transforms to martensite on cooling to room temperature and results in a still greater hardness increase. It is often desirable to temper a second time to change the martensite formed on cooling from the original tempering. This very time consuming and expensive heat treatment process should not be dissipated as a result of the coating technique.

The cutting tools of interest to this invention are of the type employed to carry out machining operations of a shearing type; this requires that the cutting tool have a configuration having a flank and a rake surface which together define a cutting edge. As the cutting tool is moved against the aluminum workpiece, the cutting edge shears off a shaving which contacts the rake surface as it is peeled therefrom. When such machining operation is carried out at speeds of 1000 sfm and in excess thereof, the temperature condition of the shaving and the work tool are at extremely high levels, predictably in the range of 450°-500° C. for aluminum and 500°-1000° C. for steel.

To deposit the coating system of this invention onto the rake face, the cutting tool substrate is placed obliquely above a silicon carbide target on an electrically conducting block. The block may be placed on a rotatable table that is grounded and supports the block. The substrates may be about six centimeters above the target. Together, the substrate, block and table may be positioned to face either a sputter etch gun or the SiC target. Target cooling may be supplied through a convenient tube. Zero voltage is applied directly to the cutting tool substrate through the support for both cleaning by sputter etching and for film deposition. Two sources of ion beams are employed, first a beam of argon ions for cleaning purposes, and another beam to promote sputtering of the SiC target.

Cleaning of the cutting tool is accomplished by sputter etching with a 1000 volt, 95 mA beam for about 2-4 minutes. The cleaning and coating operations are performed in a vacuum chamber which houses the target as well as the grounded table. A regulated flow of high purity argon is selectively introduced into the ion source through a nozzle and directed by the etch gun to produce an ion beam aimed at the tool surface. A second deposition gun is directed at the SiC target. The substrate or substrates are positioned to face the sputter etch gun. Both guns are started. Upon completion of about one minute of etching, the substrate position is graduated towards the film coating position. Upon completion of three minutes of sputter etching, the substrates are positioned to the film coating position. The sputter etch gun is then stopped and coating time is calculated to begin; coating deposition is carried out for at least 30 minutes to obtain a coating thickness of 1-4 microns.

EXAMPLES

To corroborate the scope of this invention, several high speed steel cutting tool inserts were coated according to various parameters of this invention, using a silicon carbide compound target that was sputtered with a beam of argon ions accelerated to 1500 volts at 70 mA in a narrow beam ion source. The high speed tool steel was of the M-2 type, that is, it contained 0.85% carbon, 6% tungsten, 5% molybdenum, 4% chromium, and 2% vanadium, with no cobalt present.

The resulting silicon carbide vapor condensed on the steel inserts, which had been sputter cleansed using an argon ion beam from a first ion source prior to and during the initial stages of deposition. This yields an adherent coating of silicon carbide approximately two microns thick (0.0001 inches) on the rake face of the tool insert with lesser amounts on the flank and end faces of the tool insert.

Such coated high speed tool steel inserts were deployed in turning tests at 1000 and 2000 sfcm cutting speeds against a 333 aluminum alloy workpiece in the sodium modified as well as the unmodified conditions. The cutting depth was 0.040 inches, the feed was 0.007 inches per revolution, and a water soluble oil emulsion coolant was used in all of the tests. The tool insert was configured in accordance with style SPG-422. Both uncoated high speed cutting tool inserts were employed as well as those coated with silicon carbide as above indicated, and in two instances titanium carbide and titanium nitride were employed as sputtered coatings for comparative purposes. Results of these machining tests are shown in Table I. "K" values shown for crater depth were measured using a profile tracing instrument called a profilometer at an angle of 30° from the flank cutting edge and at distances of 0.030 inches and 0.045 inches from the end cutting edge. A "K" value is defined by the equation $K=K_t/K_m$ where $K_t$ represents crater depth at its midpoint and $K_m$ represents the crater width.

As shown in Table I, the crater depth after machining with the sputtered silicon carbide coated insert was in all cases significantly lower than that obtained using an uncoated tool, or a tool insert coated with titanium carbide or titanium nitride. In fact, in two of the cases shown, no-measurable crater was present at all. Since cratering, and especially crater "breakthrough" are often the tool life end-points of high speed steel tools, the observed improvement in resistance to cratering represents a significant achievement toward lengthening the useful life of such steel tools when machining aluminum-based workpieces.

While particular embodiments of the invention have been illustrated and described, it will be obvious to those skilled in the art that various changes and modifications may be made without departing from the invention, and it is intended to cover in the appended claims all such modifications and equivalents as fall within the true spirit and scope of the invention.

TABLE I

CRATER WEAR ON SiC - COATED AND UNCOATED
M-2 HIGH SPEED STEEL INSERTS
(Workpiece: 333 Al Alloy. Coolant: 5% 589B.
Feed: .007 ipr. Style: SPG-422. Depth: .040 in.)

| Tool Condition | Speed (sfpm) | K (0°) (.030 in.) | K (30°) (.030 in.) | K (30°) (.045 in.) | Na Modif |
| --- | --- | --- | --- | --- | --- |
| Uncoated | 1000 | .0857 | .078 | .0704 | Yes |
| SiC Coated | 1000 | 0 | 0 | 0 | Yes |
| Uncoated | 1000 | .1458 | .1075 | .1387 | No. |
| SiC Coated | 1000 | .0493 | .074 | .038 | No |
| Uncoated | 2000 | .1512 | .212 | .171 | No |
| SiC Coated | 2000 | 0 | 0 | 0 | No |

We claim:

1. A cutting tool for machining aluminum-based workpieces at surface speeds equal to or in excess of 1000 sfm and having enhanced crater resistance, said tool having flank and rake surfaces, comprising:
   (a) a preshaped base of steel having a cutting edge defined by the juncture of said flank and rake surfaces;
   (b) a simple-phase crystal film of sputtered silicon carbide coated directly onto at least said rake surface, said cutting tool being characterized by a reduction in crater wear resistance of at least 0.05 in K value when (i) measured at a distance of 0.03 inches from the cutting edge, (ii) viewed at an angle of zero degrees from the flank cutting edge, (iii) compared to a cutting tool devoid of said sputtered silicon carbide film and (iv) cutting is carried out under the same conditions and parameters.

* * * * *